United States Patent [19]

Frick

[11] Patent Number: 4,913,081
[45] Date of Patent: Apr. 3, 1990

[54] APPARATUS FOR ASPIRATING COATING MATERIAL FROM THE APPLICATOR GAP BETWEEN TWO APPLICATOR ROLLERS

[75] Inventor: Andreas Frick, Freudenstadt, Fed. Rep. of Germany

[73] Assignee: Robert Burkle GmbH & Co., Freudenstadt, Fed. Rep. of Germany

[21] Appl. No.: 344,067

[22] Filed: Apr. 25, 1989

[30] Foreign Application Priority Data

Apr. 26, 1988 [DE] Fed. Rep. of Germany ....... 8805475

[51] Int. Cl.⁴ ............................................. C23C 14/00
[52] U.S. Cl. ..................................... 118/50; 118/224; 118/231; 118/501; 15/306 A
[58] Field of Search ............... 118/50, 56, 501, 70, 118/203, 209, 224, 231, 244, 249; 15/306 A

[56] References Cited

U.S. PATENT DOCUMENTS

| | | | |
|---|---|---|---|
| 1,196,438 | 8/1916 | Doyle et al. | 15/306 A |
| 2,642,030 | 6/1953 | Brink | 118/249 |
| 2,926,628 | 3/1960 | Black et al. | 118/244 |
| 3,735,729 | 5/1973 | Bird | 118/50 |
| 3,953,623 | 4/1976 | Das | 118/50 |
| 4,308,077 | 12/1981 | Bolton | 15/306 A |

*Primary Examiner*—Bernard Nozick
*Attorney, Agent, or Firm*—Spensley Horn Jubas & Lubitz

[57] ABSTRACT

A device for aspirating coating material, such as paints, from the applicator gap between two applicator rollers provides two suction tubes, which are disposed horizontally displaceably and whose outlet ends communicate with an apparatus for generating a suction pressure as well as with in apparatus for collecting the aspirated coating material. Particularly when a photoresist is applied to a board-like substrate in the manufacture of printed circuit boards, accumulations of the coating material in the region of the edge of the substrate passing through the apparatus can be avoided without mechanically straining the applicator rollers. By means of the suction pressure apparatus, the quantity of coating material accumulating as the boards to be coated pass through the apparatus can be aspirated continuously and returned via a collection tank to the supply of coating material to be used.

8 Claims, 1 Drawing Sheet

APPARATUS FOR ASPIRATING COATING MATERIAL FROM THE APPLICATOR GAP BETWEEN TWO APPLICATOR ROLLERS

FIELD OF THE INVENTION

The invention relates to an apparatus for aspirating coating material, such as paints, from the applicator gap between two applicator rollers, for example in applying a photoresist or liquid photoresist material to a board-like substrate material in the manufacture of printed circuit boards.

BACKGROUND OF THE INVENTION

Because such applicator rollers are composed of elastic material at their circumference, a gap that is wedge-shaped in the vertical plane is created on both sides of the board-like material to be coated; with time, this gap becomes plugged with coating material and causes, for example, uneven application in the area of the periphery of the boards.

An apparatus of this type is disclosed in German Utility Model No. 85 03 321. In this device, the applicator rollers are provided with strippers which produce coating-free edges on both sides of the boards to be coated. Even then, however, at places where the board in its passage does not pick up coating material, the material still accumulates on the rollers and this problem is not satisfactorily overcome in this apparatus.

Strippers also have the disadvantage of being in direct contact with the applicator rollers and pressing into the elastic surface coating of, for example, rubber, thus shortening the service life of the applicator rollers. This is a particular disadvantage when boards having various widths are to be processed with the same applicator rollers.

SUMMARY OF THE INVENTION

It is therefore an object of the invention to provide an apparatus which prevents the accumulation of the coating material in the vicinity of the edges of the boards passing through, without mechanically stressing the applicator rollers.

The above and other objects are achieved, according to the present invention, by a suction device for use in apparatus which applies coating material to a substrate, the apparatus including two rollers which are pressed toward one another in a manner to permit a substrate to pass between the rollers while coating material is applied by at least one of the rollers to a surface of the substrate, at least one of the rollers having an elastically deformable peripheral surface such that when a substrate is present between the rollers a gap is created between the rollers at locations adjacent the edges of the substrate, the device comprising:

two suction tubes each having an intake end and an outlet end;

means supporting the tubes for displacement parallel to the path of a substrate during passage between the rollers in order to position the intake end of each tube at a respective one of the gaps created between the rollers;

means connected for applying a suction pressure to the outlet ends of said tubes; and means connected for collecting coating material which is drawn through the tubes.

By suitable adjustment of the apparatus for generating the negative pressure, the coating material accumulating as the boards to be coated pass through is aspirated continuously and carried, for example, into a collecting tub, from whence it can optionally be returned to the supply of coating material to be used.

Because of the adjustable width of the two suction tubes, they can be adjusted such that even with different board widths, they still engage the particularly critical peripheral zone, and perform the aspiration of the coating material at that location.

Further features of the invention will be described below.

An exemplary embodiment of the apparatus according to the invention will now be described in further detail, in conjunction with the drawings.

DESCRIPTION OF THE PREFERRED EMBODIMENTS

Figure 1:
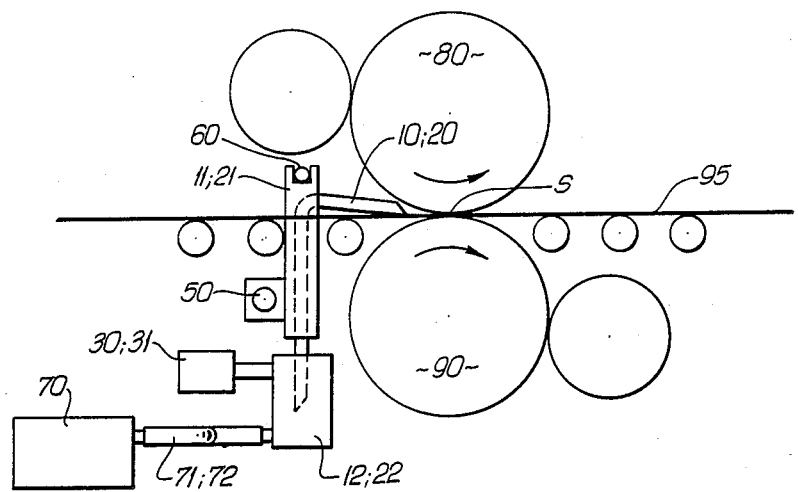
FIG. 1 is a side view of a preferred embodiment of apparatus according to the present invention.
Figure 2:
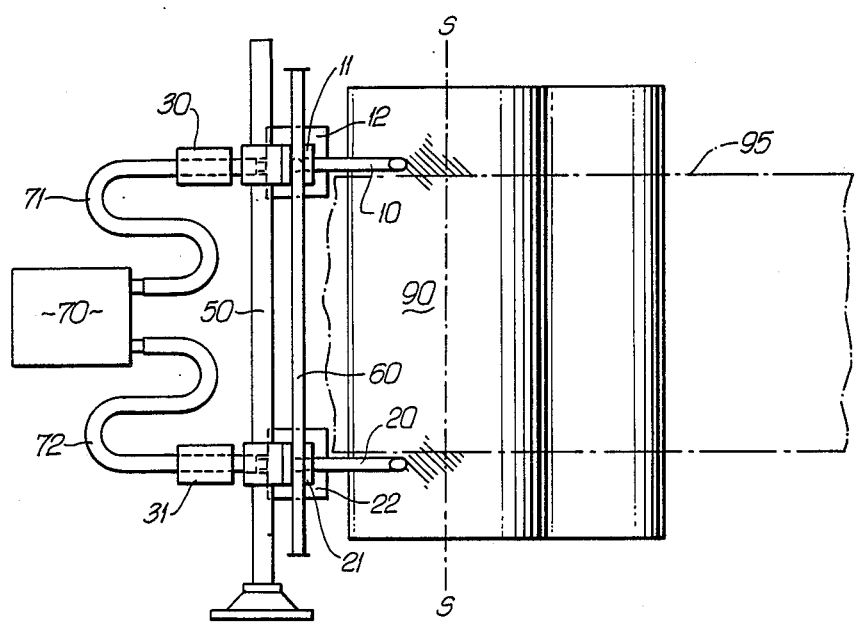
FIG. 2 is a plan view of the apparatus of FIG. 1 in the plane of a board to be coated.

As shown in FIGS. 1 and 2, a board 95 to be coated is passed continuously in a known manner, by means of feed rollers, through a gap S formed between two rollers 80 and 90 which apply a selected coating material to the top and bottom of the board. Board 95 is, for example, a printed circuit board for electrical circuits.

In the zones, shown shaded in FIG. 2, adjacent the edges of the board 95, in the vicinity of gap S, accumulations of the coating material now form in the course of time. These accumulations form because, as the result of the discontinuities represented by the edges of board 95, a wedge-shaped gap is created between rollers 80 and 90. Because of the elastic surface of the rollers, this gap tapers to a close toward the axial ends of the rollers.

The apparatus according to the invention substantially comprises two suction tubes 10 and 20, which can be pivoted or advanced into the shaded areas, that is, the areas of undesirable increased accumulation of coating material. The two suction tubes 10 and 20 are supported by a common spindle 50, so that it is simple to effect a symmetrical horizontal adjustment of the suction tubes 10 and 20, perpendicular to the direction of travel of board 95, to adapt the positions of tubes 10 and 20 to the width of board 95 and thus to the locations of the shaded areas.

Preferably, suction tubes 10 and 20 are cut obliquely at their suction ends, as shown in FIGS. 1 and 2, so that each suction end has the general form of a shovel, or scoop.

Each suction tube 10, 20 is guided in a respective retaining sleeve 11, 21, which is in turn retained on spindle 50. In addition, sleeves 11 and 21 are secured at their upper ends to a further guide tube 60 which can be displaced in the direction of travel of board 95 so that the suction, or intake, ends of suction tubes 10 and 20 can be brought to, and positioned in a stationary fashion, in the critical areas of increased accumulation of coating material.

The lower, or outlet, end of each suction tube 10, 20 discharges into a respective container 12, 22 which is closed at its top except for a passage for the respective suction tube. The upper region of each container communicates with a suction pressure apparatus, for instance a respective pump 30, 31, so that the suction pressure created in the container 12, 22 has the effect that the excess coating material is aspirated out of the region of the roller gap S via the suction tube 10, 20 into the bottom of the container 12, 22. Alternatively a single suction pump could be provided and connected to each container 12, 22 by a respective conduit.

A respective hose connection 71, 72 is connected to the lower region of each container 12, 22 and leads to a common collection container 70 for the aspirated coating material. The coating material is collected there and can optionally be re-used.

Preferably the suction pressure produced by pumps 30 and 31 is selected to draw coating material into containers 12 and 22 but not into the conduits leading to those pumps. The coating material drawn into containers 12 and 22 can then flow off under gravity into container 70. It would be possible to associate container 70 with a further suction pump to aid the removal of collected coating material.

This application relates to subject matter disclosed in Federal Republic of Germany Application No. GM 88 05 475.6, filed on Apr. 26, 1988, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A suction device for use in apparatus which applies coating material to a substrate, the apparatus including two rollers which are pressed toward one another in a manner to permit a substrate to pass between the rollers while coating material is applied by at least one of the rollers to a surface of the substrate, at least one of the rollers having an elastically deformable peripheral surface such that when a substrate is present between the rollers a gap is created between the rollers at locations adjacent the edges of the substrate, said device comprising:

two suction tubes each having an intake end and an outlet end;

means supporting said tubes for displacement parallel to the path of a substrate during passage between the rollers in order to position said intake end of each said tube at a respective one of the gaps created between the rollers;

means connected for applying a suction pressure to said outlet ends of said tubes; and means connected for collecting coating material which is drawn through said tubes.

2. An apparatus as defined in claim 1 wherein said intake end of each said suction tube is cut obliquely end to give said intake end the form of a shovel.

3. An apparatus as defined in claim 1 further comprising a horizontal spindle extending transverse to the direction of passage of a substrate between the rollers and supporting both of said suction tubes.

4. An apparatus as defined in claim 3 further comprising two retaining sleeves each supporting a respective suction tube and each supported by said spindle.

5. An apparatus as defined in claim 4 further comprising a guide tube extending generally parallel to said spindle and secured to said retaining sleeves.

6. An apparatus as defined in claim 1 further comprising two first containers each receiving said outlet end of a respective suction tube, each said first container having an upper region communicating with said means for applying a suction pressure and a lower region communicating with said means for collecting coating material.

7. An apparatus as defined in claim 6 wherein said means for collecting coating material comprises a single collection container and two flexible connections each connected between said collection container and the lower region of a respective first container.

8. In apparatus which applies coating material to a substrate, the apparatus including two rollers which are pressed toward one another in a manner to permit a substrate to pass between the rollers while coating material is applied by at least one of the rollers to a surface of the substrate, at least one of the rollers having an elastically deformable peripheral surface such that when a substrate is present between the rollers a gap is created between the rollers at locations adjacent the edges of the substrate, the improvement comprising a suction device comprising:

two suction tubes each having an intake end and an outlet end;

means supporting said tubes for displacement parallel to the path of a substrate during passage between said rollers in order to position said intake end of each said tube at a respective one of the gaps created between said rollers;

means connected for applying a suction pressure to said outlet ends of said tubes; and means connected for collecting coating material which is drawn through said tubes.

* * * * *